United States Patent
Gao

(10) Patent No.: US 11,202,393 B2
(45) Date of Patent: Dec. 14, 2021

(54) MULTI-FUNCTION ADAPTING MODULES FOR ELECTRONICS COOLING

(71) Applicant: Baidu USA LLC, Sunnyvale, CA (US)

(72) Inventor: Tianyi Gao, Sunnyvale, CA (US)

(73) Assignee: BAIDU USA LLC, Sunnyvale, CA (US)

( * ) Notice: Subject to any disclaimer, the term of this patent is extended or adjusted under 35 U.S.C. 154(b) by 0 days.

(21) Appl. No.: 16/782,353

(22) Filed: Feb. 5, 2020

(65) Prior Publication Data
US 2021/0243918 A1    Aug. 5, 2021

(51) Int. Cl.
*H05K 7/20* (2006.01)
*H05K 7/14* (2006.01)

(52) U.S. Cl.
CPC ....... *H05K 7/20781* (2013.01); *H05K 7/1488* (2013.01); *H05K 7/20181* (2013.01); *H05K 7/20254* (2013.01); *H05K 7/20263* (2013.01); *H05K 7/20272* (2013.01); *H05K 7/20281* (2013.01); *H05K 7/20754* (2013.01)

(58) Field of Classification Search
CPC ......... H05K 7/20218–20281; H05K 7/20763–2079; H05K 7/20836
See application file for complete search history.

(56) References Cited

U.S. PATENT DOCUMENTS

| | | | | |
|---|---|---|---|---|
| 7,372,698 | B1* | 5/2008 | Tilton | H05K 7/20772 165/104.33 |
| 7,791,882 | B2* | 9/2010 | Chu | H05K 7/20745 361/698 |
| 7,984,621 | B2* | 7/2011 | Park | F24F 1/022 62/333 |
| 8,007,228 | B2* | 8/2011 | Wang | F04D 29/542 415/146 |
| 9,038,406 | B2* | 5/2015 | Campbell | H05K 7/20609 62/259.2 |
| 9,043,035 | B2* | 5/2015 | Chainer | G06F 1/206 700/282 |
| 9,052,722 | B2* | 6/2015 | Chainer | G06F 1/206 |
| 9,151,543 | B2* | 10/2015 | Iyengar | H05K 7/2079 |
| 9,173,324 | B2* | 10/2015 | Campbell | F28F 1/126 |
| 9,253,921 | B2* | 2/2016 | Campbell | H05K 7/20281 |
| 9,295,181 | B2* | 3/2016 | Campbell | H05K 7/20281 |

(Continued)

FOREIGN PATENT DOCUMENTS

CN       106659081 A   *  5/2017

*Primary Examiner* — Robert J Hoffberg
(74) *Attorney, Agent, or Firm* — Womble Bond Dickinson (US) LLP

(57) ABSTRACT

A modular cooling system includes a fluid pump in fluid communication with one or more cooling elements to cool electronics components; a heat exchanger in fluid communication with the fluid pump; a heat exchanger valve upstream of the heat exchanger; and a fluid supply valve positioned between a cooling fluid supply and the one or more cooling elements. When the heat exchanger valve and the fluid supply valve are in a first position, fluid is directed from the cooling fluid supply to the one or more cooling elements, bypassing the heat exchanger and the fluid pump. When the heat exchanger valve and the fluid supply valve are in a second position, fluid is cut off from the cooling fluid supply and a cooling fluid return and circulated through the heat exchanger and the fluid pump.

7 Claims, 6 Drawing Sheets

(56) References Cited

U.S. PATENT DOCUMENTS

| | | | | |
|---|---|---|---|---|
| 9,338,924 B2* | 5/2016 | Campbell | .......... | H05K 7/20781 |
| 9,386,727 B2* | 7/2016 | Barringer | .......... | H05K 7/20709 |
| 9,414,519 B2* | 8/2016 | Campbell | ............... | F28F 1/126 |
| 9,655,282 B2* | 5/2017 | Barringer | .......... | H05K 7/20272 |
| 9,811,126 B2* | 11/2017 | Chainer | .................... | G06F 1/20 |
| 10,334,763 B2* | 6/2019 | Gao | .................. | H05K 7/20818 |
| 10,342,165 B2* | 7/2019 | Iyengar | ................ | H05K 7/2079 |
| 10,440,862 B2* | 10/2019 | Iyengar | .................. | F28D 15/00 |
| 10,716,239 B2* | 7/2020 | Chainer | .................... | G06F 1/20 |
| 2020/0029470 A1* | 1/2020 | Iyengar | ............. | H05K 7/20836 |
| 2020/0396867 A1* | 12/2020 | Chainer | .................... | G06F 1/20 |

* cited by examiner

MULTI-FUNCTION ADAPTING MODULES FOR ELECTRONICS COOLING

FIELD OF THE DISCLOSURE

Embodiments of the present invention relate generally to server cooling systems. More particularly, embodiments of the invention relate to a modular server cooling system.

BACKGROUND

Previous data center and server cooling solutions required a modification on the rack or the facility infrastructure to be able to support the deployment of new hardware. According to previous techniques, for a rack level redundant design, deploying two sets of rack manifolds may be required, as well as a second completely identical system on a rack level as well as a server level. This approach occupies a significant amount of space, requires a great amount of design efforts, and increases design cost significantly. In addition, a solution is needed for adapting a server in a system which works with different types of fluids.

BRIEF DESCRIPTION OF THE DRAWINGS

Embodiments of the invention are illustrated by way of example and not limitation in the figures of the accompanying drawings in which like references indicate similar elements.

DETAILED DESCRIPTION

Figure 1:
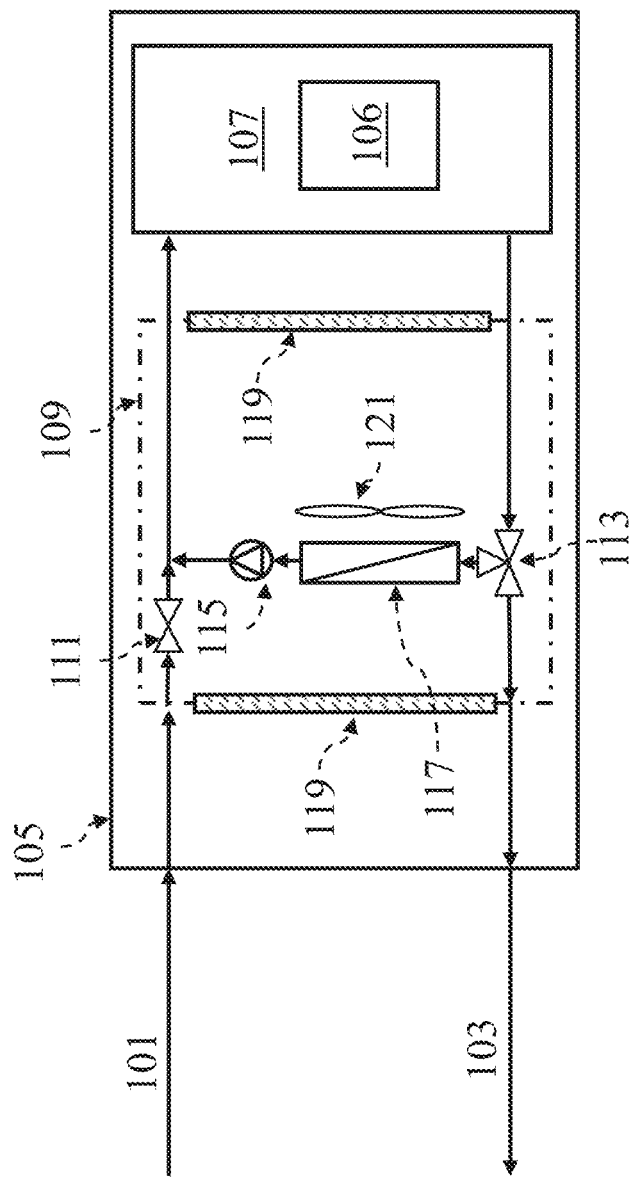
FIG. 1 shows a design of an adapting module, according to an embodiment of the present disclosure.

Reference in the specification to "one embodiment" or "an embodiment" means that a particular feature, structure, or characteristic described in conjunction with the embodiment can be included in at least one embodiment of the invention. The appearances of the phrase "in one embodiment" in various places in the specification do not necessarily all refer to the same embodiment.

In the description of the embodiments provided herein, the terms "coupled" and "connected," along with their derivatives, may be used. It should be understood that these terms are not intended as synonyms for each other. "Coupled" is used to indicate that two or more elements, which may or may not be in direct physical or electrical contact with each other, co-operate or interact with each other. "Connected" is used to indicate the establishment of communication between two or more elements that are coupled with each other. Additionally, the terms "server," "client," and "device" are intended to refer generally to data processing systems rather than specifically to a particular form factor for the server, client, and/or device.

Embodiments described herein provide for a solution for developing and deploying cooling solutions for servers or IT hardware equipment. In some embodiments, the present disclosure provides for the compatibility of different servers and IT equipment with facility infrastructures (such as data centers, racks, and other deployment environments). For example, a data center and a server are often not designed at the same time or by the same group of people. Furthermore, the lift time of a data center and a server are different. Therefore, a data center may not be able to support operating multiple types of servers even though there are multiple design standards to follow. The variations and generational renewal in servers and IT equipment are much faster than the generational renewal of data center facility infrastructure. For example, the data center cooling design may not able to support certain types of servers. Embodiments of the present disclosure provide for an adapting module which may be used to solve these compatibility issues.

In liquid cooling infrastructure, the liquid may be supplied to a rack manifold and then to a server liquid cooling loop. The rack manifold can be considered as a single point of failure. This means that if the rack manifold or rack liquid source fails, the whole system shuts down. This does not satisfy the requirement of a fully redundant system design, especially in some critical cloud services businesses. Embodiments of the present disclosure provide a redundant design method for such open loop infrastructures, and ensure that the system can continue running even if a single point failure happens at the fluid supply.

Some embodiments of the present disclosure enable dynamic variations in different types of hardware systems, including their operating requirements and/or cooling requirements. When hardware configurations and/or cooling configurations are changed, the current design enables a user to quickly reconfigure the cooling design without requiring a full system redesign. According to embodiments of the present disclosure, an adapting module can be used for designing and deploying different servers or IT hardware in different environments. The adapting module includes multiple connecting ports which are used for fluidly connecting to the server cooling inlet and outlet, and also for connecting to external cooling sources. In some embodiments, some components are assembled within the adapting module for providing additional functions, such as transferring the system from an open loop to a closed loop by using an air cooled heat exchanger loop, and separating and merging a primary loop and a secondary loop by introducing a liquid cooling loop. The internal components of the adapting module can also include multiple components or system loops for additional functions for better system reliability, system capabilities, and different operating requirements.

In some embodiments, multiple modules can be assembled together for different application requirements in different use cases. Such modules can provide a means for customizing the cooling design based on different availabilities on the deployment environment side and requirements from the sever and IT side.

System Overview

FIG. 1 shows a design of an adapting module 109, according to an embodiment of the present disclosure. In this embodiment, the fluid supply 101 and the fluid return 103 can be the primary cooling sources from either the rack or the data center facilities. In some embodiments, this can be implemented in a deployment environment, or in the edge deployment environment. Different fluid sources can be used in different embodiments. The server or edge unit 105 shown in FIG. 1 can be considered as a fully redundant system once the adapting module 109 is integrated to the electronics 107. In some embodiments, the electronics 107 represent the server main chassis where the main circuit board or motherboard, as well as all the electronics components, are packaged. In some embodiments, the electronics 107 may also have their own cooling elements 106, which can be mounted on components on the motherboard. In some embodiments, the cooling design for the electronics 107 can be in different forms, either air cooled or liquid cooled. The liquid supply and liquid return for the electronics are considered as the primary cooling source for the electronics 107.

In some embodiments, the adapting module 109 can be deployed with a relatively high power density electronics package, and the module configurations can be adjusted based on the specifications of the electronics package. The adapting module 109 can be located between the fluid supply 101 and the electronics 107. In this embodiment, the main fluid supply 101 and return 103 can be directly connected to the electronics 107 thorough the adapting module 109 in normal conditions. When the two-way valve 111, also referred to as a fluid supply valve, is in a first open position and the three-way valve 113, also referred to as a heat exchanger valve, directs fluid from the electronics 107 directly to the fluid return 103, this can be considered a first open-loop position. However, as mentioned in the previous section, when the main fluid supply 101 and return 103 fail, the adapting module 109 can be used as a backup or redundant system. In some embodiments, the adapting module 109 can be removed from the electronics 107 using blind mating connectors that can be equipped on the adapting module 109.

When in backup mode, the adapting module 109 switches the system to a closed loop. Firstly, the system three-way valve 113 switches to a second position to stop the fluid going back to the fluid return 103, and the two-way valve 111 switches to a second closed position. This isolates a portion of the cooling fluid within an interior closed loop. Then the pump 115 turns on, and at the same time a fan 121 starts to operate after the louvers 119 open. The fluid and air flow then pass through the heat exchanger 117. At this point, the system has switched to closed loop operation. In this closed loop mode, the cooling source is the airflow from the fan 121 and the louvers 119. When the main fluid supply 101 and return 103 are repaired, the system can switch back to open loop operation. In some embodiments, this design enables a system to operate with redundancy in many commonly used rack liquid cooling infrastructures.

Figure 2:
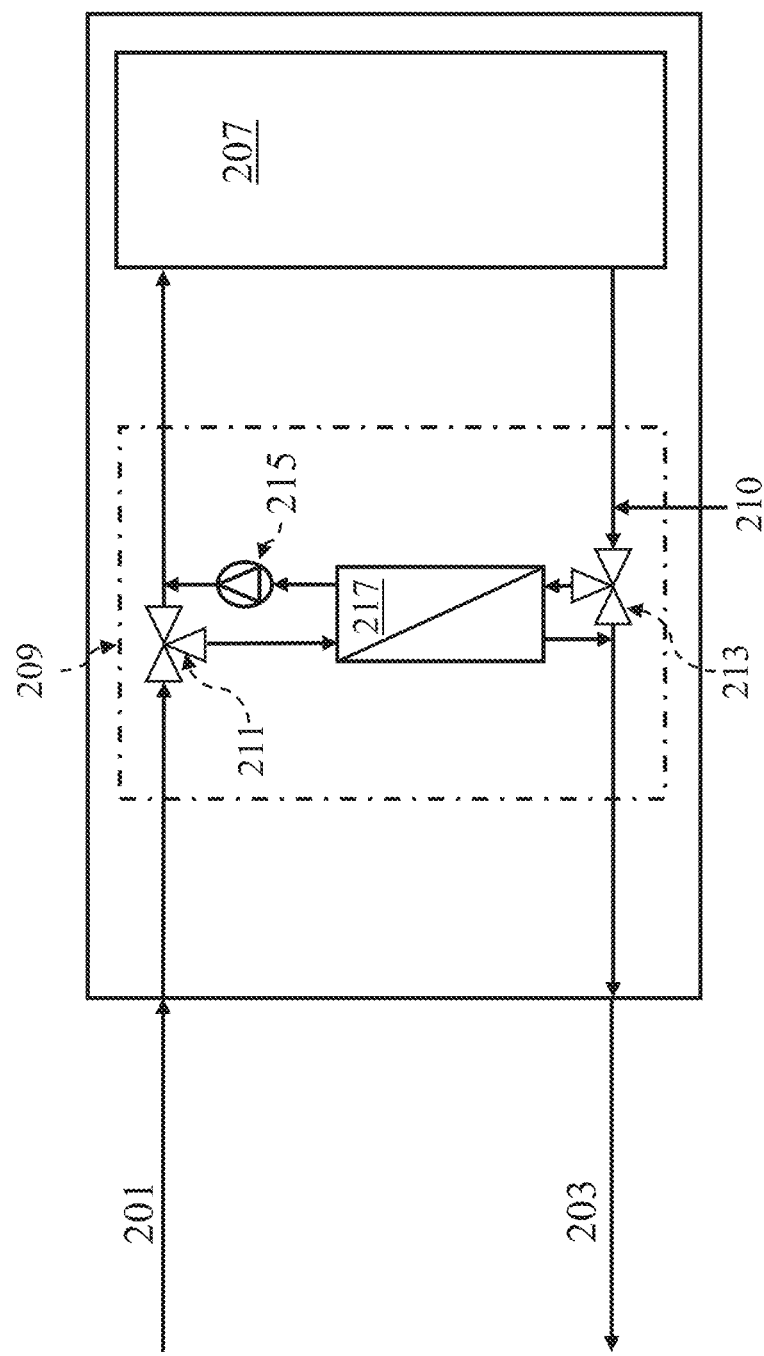
FIG. 2 shows another design of an adapting module, according to an embodiment of the present disclosure.

FIG. 2 shows another design of an adapting module 209, according to an embodiment of the present disclosure. This embodiment shows an adapting module 209 for switching a system operating in a primary loop or a secondary loop. A primary loop connection means a direct connection of the cooling fluid supply 201, through the server electronics 207, and then through the fluid return 203 to a facility cooling source. A secondary loop connection means forming a separate loop for the server electronics 207 and utilizing the primary loop as a cooling source.

In some embodiments, the adapting module 209 includes several control valves 211, 213 and a liquid to liquid heat exchanger 217. The switching of the two three way valves 211, 213 can form two separate loops passing through the liquid to liquid heat exchanger 217. The pump 215 can be used for recirculating the fluid moving within the secondary loop, which includes a flow path through the heat exchanger 217, the pump 215, and the electronics 207.

For example, if the facility fluid is chilled water or some other type of water, or a fluid supply loop supplies fluid such as Glycol based deionized water, it cannot be used for two-phase electronics cooling. In some embodiments, by using an adapting module, the system can be adapted to such a facility. In such module, a filling port 210 may be used for filling the secondary loop, in some applications, especially when the system requires to switch between the primary loop and secondary loop, or between different loops.

Figure 3:
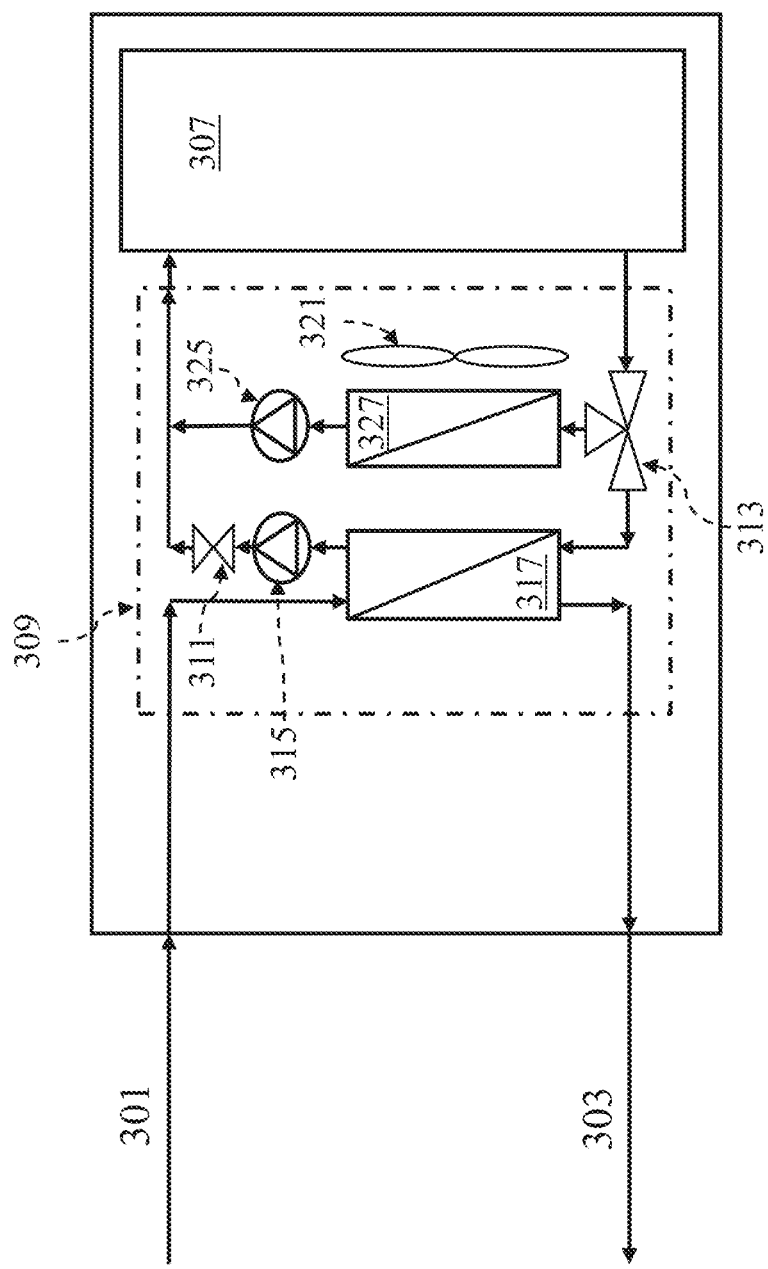
FIG. 3 shows another design of an adapting module, according to an embodiment of the present disclosure.

FIG. 3 shows another design of an adapting module 309, according to an embodiment of the present disclosure. This embodiment shows an adapting module 309 with multiple loops. The adapting module 309 provides a function of forming a secondary loop when connecting to the main fluid supply 301 and fluid return 303, and at the same time, providing a backup cooling method using air cooled heat exchanger 327 and a fan 321. In this embodiment, an external loop includes a fluid path from the fluid supply 301 to the fluid return 303 through the first heat exchanger 317. The adapting module 309 includes a first pump 315 configured to pump fluid through the first heat exchanger 317 when the first valve 311 is in an open position and the second valve 313 is directing fluid from the electronics 307 to the first heat exchanger 317. When the first valve is in a second closed position and the second valve 313 is in a second position as well, fluid can be pumped using the second pump 325 through the second air cooled heat exchanger 327. In some embodiments, the first pump 315 and the second pump 325 can be replaced by a single pump, which can be used for pumping fluid through the first heat exchanger 317 and the second air cooled heat exchanger 327.

Figure 4:
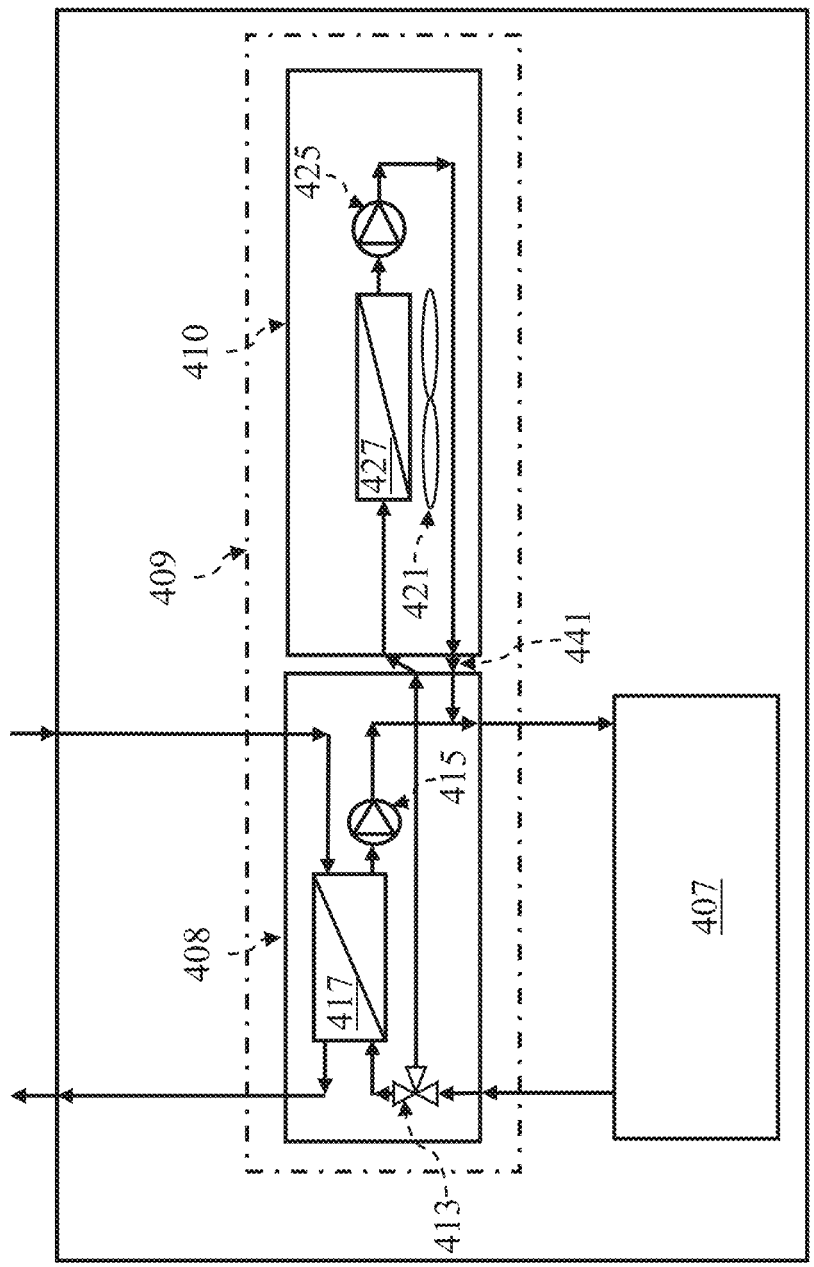
FIG. 4 shows another design of an adapting module, according to an embodiment of the present disclosure.

FIG. 4 shows another design of an adapting module 409, according to an embodiment of the present disclosure. This embodiment shows an adapting module 409 with multiple cooling modules 408, 410. In this embodiment, fluid can pass through the first heat exchanger 417 of the first cooling module 408 from an external fluid supply. The first cooling module 408 can be a liquid to liquid cooling module including a fluid pump 415, and fluid can be selectively directed to the second cooling module 410 using a valve 413. In this embodiment, connecting ports 441 are located on the adapting module and they can be used for connecting the first cooling module 408 with any other standard or customizes modules, such as a second air cooled cooling module 410 with its own fan 421, pump 425, and independent heat exchanger 427. The second cooling module 410 can be also used as a temporary or backup cooling solution if the first cooling module 408 or the cooling fluid source fails for a certain period of time. Incorporating such an adapting module can provide increased redundancy and enable continuous 24/7 operation of the electronics 407, in some embodiments. According to some embodiments, the design illustrated in FIG. 4 allows an adapting module to be extended based on an existing adapting module, if needed.

Figure 5:
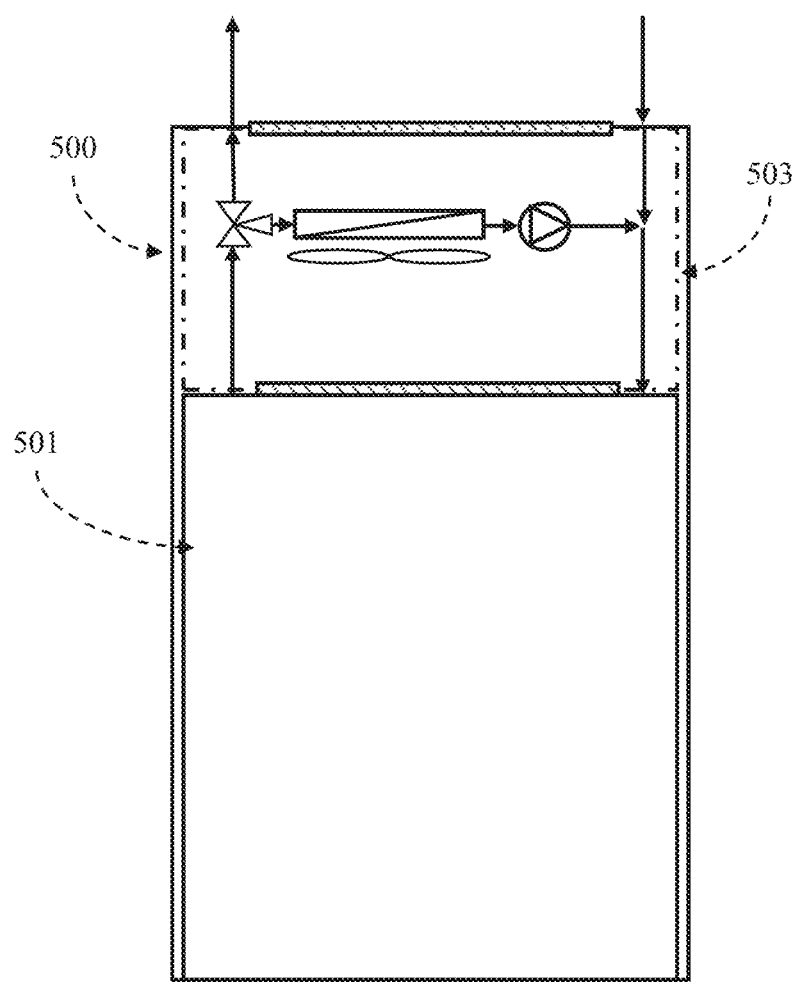
FIG. 5 shows a top view schematic diagram of an adapting module deployed on a server chassis and a rack, according to an embodiment of the present disclosure.

FIG. 5 shows a schematic diagram of an adapting module 503 deployed on a server chassis 501 and a rack 500, according to an embodiment of the present disclosure. In some embodiments, the server chassis 501 can be a main server motherboard area. The adapting module 503 can be implemented as a part of the server chassis 501, in some embodiments. In some embodiments, the cooling adapting module 503 can be located within a dedicated section of the server chassis 501 based on the chassis layout and design, form factors, and other factors. In one embodiment, the solution shown in FIG. 5 can be considered as an edge deployment scenario. In such a scenario, the fluid connecting ports are used to connect a cooling source loop dedicated for the edge devices.

Figure 6:
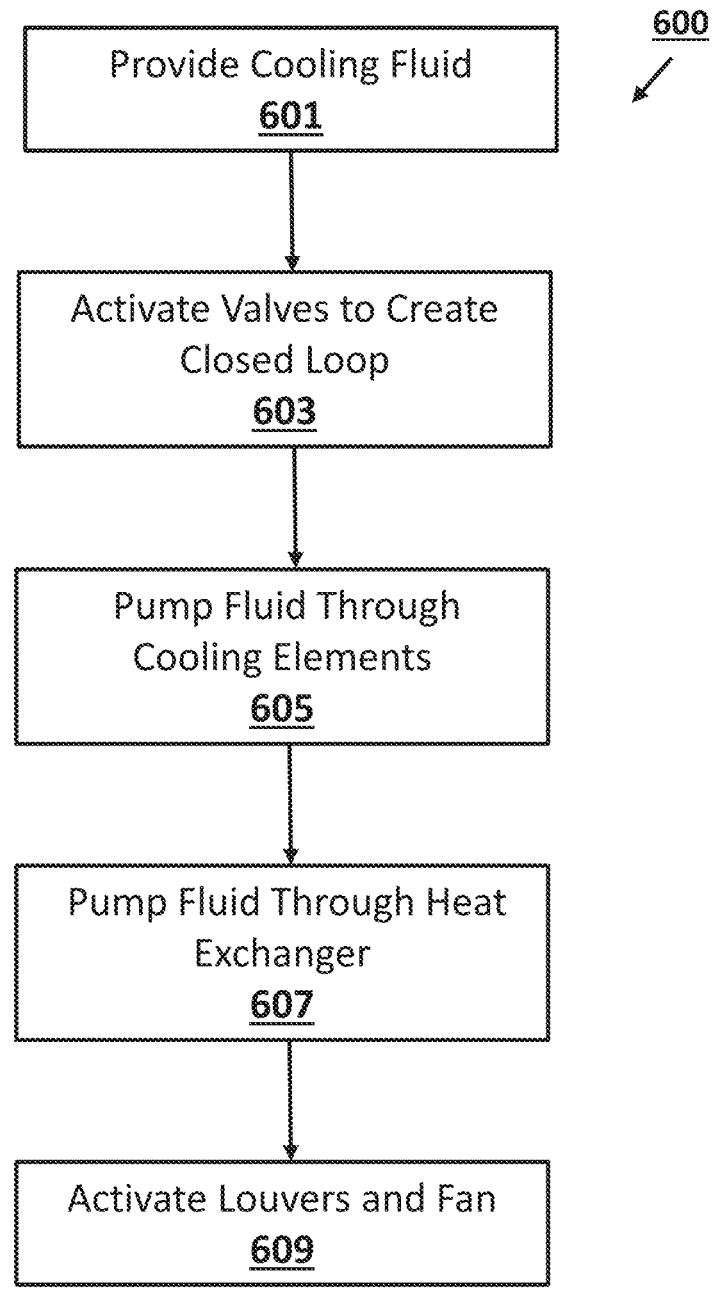
FIG. 6 illustrates a flow chart of an example method for cooling a server, according to embodiments of the present disclosure.

FIG. 6 illustrates a flow chart of an example method 600 for cooling a server, according to embodiments of the present disclosure. In this embodiment, method 600 begins with providing 601 cooling fluid from a cooling fluid supply to one or more cooling elements to cool electronic components.

At operation 603, one or more valves are activated to isolate fluid within an internal fluid loop. In some embodiments, activating the one or more valves includes switching the valves between a first position and a second position. In the first position, fluid is directed from the cooling fluid supply to the one or more cooling elements, bypassing the heat exchanger and the fluid pump. In the second position, fluid is cut off from the cooling fluid supply and a cooling fluid return and circulated through the heat exchanger and the fluid pump. In some embodiments, the valves switch from the first position to the second position in response to detecting a long term or short term loss of the cooling fluid supply.

At operation 605, the isolated fluid within the internal fluid loop is pumped to the one or more cooling elements. At operation 607, the isolated fluid is pumped through a heat exchanger and fluid pump within the internal fluid loop. In some embodiments, the heat exchanger is an air-cooled heat exchanger, and switching the valves from the first position to the second position transforms the server cooling system from a liquid cooling system to an air-cooled system. In some embodiments, the method 600 also includes switching the valves between the second position to the first position to transform the server cooling system back to a liquid cooling system.

In some embodiments, if an air-cooled heat exchanger is used, the method 600 can continue at operation 609 by activating one or more louvers and a fan to direct airflow through the air-cooled heat exchanger.

In some embodiments, the procedure of selection, design or customization of an adapting module can include a number of specific considerations. One embodiment of the present disclosure provides an adapting module that enables multiple functions and cooling requirements for operating servers and hardware systems in certain deployment environment. Example server cooling requirements can include, for example, cooling capacity, cooling fluid, connectors, and the uptime requirements of the system being cooled. Example deployment environment considerations can include, for example, external cooling sources, air and/or fluid cooling sources, types of fluid, connecting methods, and the availability of cooling sources. Example system integration requirement considerations can include data center/rack requirements, edge environment requirements, and form factor. Example cooling adapting module configuration requirements can include, for example, types of cooling units, connector types, single or multi-loop cooling loops, and cooling method selection (e.g., liquid or two-phase cooling methods, etc.). Server users, such as cloud service users or edge computing service users, may have their own unique requirement on the services and hardware. The services or the software architecture may be designed uniquely for such requirement. Therefore, an optimized solution can include a flexible hardware design configuration. The design procedure and considerations discussed above can be customized in certain use cases.

One skilled in the art would recognize that various adjustments can be made to the system within the scope of this disclosure. The following clauses and/or examples pertain to specific embodiments or examples thereof. Specifics in the examples may be used anywhere in one or more embodiments. The various features of the different embodiments or examples may be variously combined with some features included and others excluded to suit a variety of different applications. Examples may include subject matter such as a method, means for performing acts of the method, at least one machine-readable medium including instructions that, when performed by a machine cause the machine to performs acts of the method, or of an apparatus or system according to embodiments and examples described herein. Various components can be a means for performing the operations or functions described.

One embodiment provides for a modular cooling system. The system includes a fluid pump in fluid communication with one or more cooling elements to cool electronics components. The system also includes a heat exchanger in fluid communication with the fluid pump. The system also includes a heat exchanger valve upstream of the heat exchanger. The system also includes a fluid supply valve positioned between a cooling fluid supply and the one or more cooling elements. When the heat exchanger valve and the fluid supply valve are in a first position, fluid is directed from the cooling fluid supply to the one or more cooling elements, bypassing the heat exchanger and the fluid pump. When the heat exchanger valve and the fluid supply valve are in a second position, fluid is cut off from the cooling fluid supply and a cooling fluid return and circulated through the heat exchanger and the fluid pump. In some embodiments, the system also includes a louver and fan to direct airflow through the heat exchanger when the heat exchanger valve and the fluid supply valve are in the second position. In some embodiments, the heat exchanger valve and the fluid supply valve switch from the first position to the second position in response to detecting a long term or short term loss of the cooling fluid supply. In some embodiments, the heat exchanger, fluid pump, heat exchanger valve, and fluid supply valve are integrated into an adapting module that is removably attached to the cooling fluid supply and the one or more cooling elements. In some embodiments, the adapting module includes fluid connectors to fluidly connect to the cooling fluid supply and the one or more cooling elements. In some embodiments, the adapting module can connect to the electronics package using blind mating quick disconnects.

Another embodiment provides for an adapting cooling module including: a first fluid loop to direct cooling fluid from a cooling fluid supply through a first heat exchanger; a second fluid loop in fluid communication with one or more cooling elements to cool electronics components; a first fluid pump within the second fluid loop to pump fluid through the one or more cooing elements; and fluid connectors to fluidly connect the first fluid loop to the cooling fluid supply and the second fluid loop to the one or more cooling elements. In some embodiments, the adapting cooling module also includes a first valve to selectively direct fluid between the cooling fluid supply, the first heat exchanger, and the one or more cooling elements; and a second valve to selectively direct fluid between the one or more cooling elements, the first heat exchanger and the first fluid pump, and a cooling fluid return. In some embodiments, the first valve and the second valve are three-way fluid valves. In some embodiments, the adapting cooling module also includes a first valve located within the second fluid loop to selectively direct fluid through the first fluid pump and the first heat exchanger; and a second valve which, in a first position directs fluid through the second fluid loop including the first heat exchanger and the first fluid pump, and in a second position directs fluid through a third fluid loop including a second heat exchanger and a second fluid pump. In some embodiments, the first heat exchanger is a liquid to liquid heat exchanger, and the second heat exchanger is an air-cooled heat exchanger. In some embodiments, the adapting cooling module also includes at least one louver and fan to direct air through the second heat exchanger. In some embodiments, the adapting cooling module also includes a third valve to selectively direct fluid from the second fluid loop to a secondary cooling module including an independent heat exchanger. In some embodiments, the secondary cooling module also includes an independent fluid pump. In some embodiments, the secondary cooling module is an air-cooled cooling module and includes at least one fan to direct air through the independent heat exchanger. In some embodiments, the adapting cooling module also includes a number of secondary cooling module connecting ports to detachably connect the secondary cooling module with the second fluid loop.

Another embodiment provides for a method of cooling a server. The method includes providing cooling fluid from a cooling fluid supply to one or more cooling elements to cool electronics components. The method also includes activating one or more valves to isolate fluid within an internal fluid loop. The method also includes pumping isolated fluid within the internal fluid loop to the one or more cooling elements. The method also includes pumping the isolated fluid through at least one heat exchanger and fluid pump within the internal fluid loop. In some embodiments, the method also includes switching the valves between a first position and a second position, wherein when the valves are in the first position, fluid is directed from the cooling fluid supply to the one or more cooling elements, bypassing the heat exchanger and the fluid pump, and when the valves are in a second position, fluid is cut off from the cooling fluid supply and a cooling fluid return and circulated through the heat exchanger and the fluid pump. In some embodiments, the valves switch from the first position to the second position in response to detecting a long term or short term loss of the cooling fluid supply. In some embodiments, switching the valves from the first position to the second position transforms a server cooling system from a liquid cooling system to an air-cooled system. In some embodiments, the method also includes switching the valves between the second position to the first position to transform the server cooling system back to a liquid cooling system.

In the foregoing specification, the invention has been described with reference to specific embodiments thereof. However, various modifications and changes can be made thereto without departing from the broader spirit and scope of the invention. The specification and drawings are, accordingly, to be regarded in an illustrative rather than a restrictive sense.

What is claimed is:

1. A modular cooling system, comprising:
an adapting module disposed within a server unit, the adapting module comprising:
a fluid pump in fluid communication with one or more cooling elements to cool electronics components within the server unit;
a heat exchanger in fluid communication with the fluid pump;
a heat exchanger valve upstream of the heat exchanger; and
a fluid supply valve positioned between a cooling fluid supply and the one or more cooling elements, wherein
when the heat exchanger valve and the fluid supply valve are in a first position, a cooling fluid is directed from the cooling fluid supply to the one or more cooling elements, bypassing the heat exchanger and the fluid pump,
when the heat exchanger valve and the fluid supply valve are in a second position, the cooling fluid is cut off from the cooling fluid supply and a cooling fluid return and circulated through the heat exchanger and the fluid pump, and
in response to a loss of the cooling fluid provided through the cooling fluid supply, the heat exchanger valve and the fluid supply valve switch from the first position to the second position.

2. The modular cooling system of claim 1, further comprising:
at least one louver and a fan configured to direct air through the heat exchanger when the heat exchanger valve and the fluid supply valve are in the second position, the at least one louver and the fan also being integrated within the adapting module.

3. The modular cooling system of claim 1, wherein the adapting module is removably attached to the cooling fluid supply and the one or more cooling elements.

4. The modular cooling system of claim 3, wherein the adapting module includes a plurality of fluid connectors to fluidly connect to the cooling fluid supply and the one or more cooling elements.

5. A method of cooling a server comprising:
providing a cooling fluid from a cooling fluid supply to one or more cooling elements to cool electronics components within a server unit;
activating one or more valves located within an adapting module to isolate the cooling fluid within an internal fluid loop, the adapting module being disposed within the server unit and comprising a fluid pump and at least one heat exchanger;
pumping the cooling fluid within the internal fluid loop to the one or more cooling elements; pumping the cooling fluid through the at least one heat exchanger and the fluid pump within the internal fluid loop, bypassing the fluid pump and the at least one heat exchanger; and
switching the one or more valves from a first position to a second position in response to detecting a loss of the cooling fluid provided through the cooling fluid supply, wherein the switching the one or more valves between the first position and the second position, includes:
when the one or more valves are in the first position, the cooling fluid is directed from the cooling fluid supply to the one or more cooling elements, bypassing the at least one heat exchanger and the fluid pump, and
when the one or more valves are in a second position, the cooling fluid is cut off from the cooling fluid supply and a cooling fluid return and circulated through the at least one heat exchanger and the fluid pump.

6. The method of claim 5, wherein the switching the one or more valves from the first position to the second position transforms a server cooling system from a liquid cooling system to an air-cooled system.

7. The method of claim 6, further comprising: switching the one or more valves between the second position to the first position to transform the server cooling system from the air-cooled system back to the liquid cooling system.

* * * * *